WITNESSES
Alfred Y. Colaizzi
Donald M. Winegar

INVENTOR
Allan I. Bennett
BY
C. L. Menzemer
ATTORNEY 3,682,708
SOLAR CELL
Allan I. Bennett, Export, Pa., assignor to Westinghouse Electric Corporation, Pittsburgh, Pa.
Filed Oct. 7, 1969, Ser. No. 864,366
Int. Cl. H01c *15/02*
U.S. Cl. 136—89 19 Claims

ABSTRACT OF THE DISCLOSURE

A solar cell with improved efficiency is provided with a convoluted PN junction whereby a higher proportion of carriers produced by exposure of the solar cell to a source of radiation will be collected by the PN junction rather than being lost by recombination and the solar cell has an increased resistance to radiation damage.

BACKGROUND OF THE INVENTION

(1) Field of the invention

This invention relates to solar cells and particularly to an improved solar cell having essentially a convoluted, single PN junction providing a plurality of generally parallel PN junction planes separated by distances of the order of not over one diffusion length and parallel to the top surface whereby carriers generated within the cell are more efficiently collected by the PN junction of the cell.

(2) Description of the prior art

One of the factors limiting the efficiency of a solar cell is the fraction of photoelectrically produced minority carriers which reach the PN junction of the solar cell before recombining. Surface and bulk recombination can both play important roles in the recombination of minority carriers generated within the solar cell. Even in the best of present day solar cells, approximately one-third of the generated carriers are lost through recombination.

In an N/P type solar cell, holes produced in the N-region may be lost by recombination in the bulk or at the front surface of the cell. Similarly, electrons produced in the P-region may recombine internally or at the rear surface of the solar cell. In order to minimize recombination in the N-region or at the front surface on which the solar radiation falls, the depth of the PN junction (actually the N-region thickness) is generally made quite small, of the order of one-half micron. In this instance most photons will pass through this N-layer and be absorbed in the P-region thereby producing hole-electron pairs, with a major portion being generally absorbed in the forward portion of the P-region near the PN junction. The major contributing cause of low collection efficiency then becomes bulk recombination of the electrons in the P-region, and surface recombination of holes at the electrical contact affixed to the rear of the solar cell. Generally speaking, all carriers generated in the back half of the P-region of the N/P solar cell will be lost by recombination since they are more likely to reach the back surface of the solar cell rather than the PN junction. Some of these carriers do, however, reach the PN junction but a corresponding fraction of those produced in the front half of the P-region also reach the back surface of the solar cell, with no net gain in efficiency. Of those carriers generated in the forward portion of the P-region which migrate towards the PN junction, many are lost by bulk recombination. Fortunately for solar cell efficiency, the exponential absorption of light results in most of the carrier generation occurring near the front of the solar cell.

Carrier collection efficiency is, therefore, a significant problem in solar cell design. To date, approaches to solution of the problem have included making the lifetime, and therefore the diffusion length, for minority carriers in the P-region as high as possible, and/or introducing a graded distribution of impurities into the P-region near the PN junction, thereby providing a built-in electric field which urges electrons toward the PN junction. Even with these improvements approximately one-third of the generated carriers in a solar cell are lost through recombination.

An object of this invention is to provide a solar cell having a PN junction construction for improving the efficiency of collecting the photoelectrically produced minority carriers.

An object of this invention is to provide a solar cell having an improved resistance to nuclear particle radiation damage.

Another object of this invention is to provide a semiconductor solar cell having a convoluted PN junction so as to present a plurality of generally parallel junctions contained in the semiconductor body.

Other objects of this invention will, in part, be obvious and will, in part, appear hereinafter.

SUMMARY OF THE INVENTION

In accordance with the teachings of this invention there is provided a solar cell comprising a body of semiconductor material having two substantially parallel opposed major surfaces, one of the surfaces being exposed to radiation. The cell has at least two PN junctions through which photons of radiation can pass going from the top surface to the bottom surface of the cell. Each PN junction is substantially parallel to the two opposed surfaces and the junctions are formed by a plurality of substantially parallel alternate layers of first type and second type semiconductivity semiconductor material. All layers of like semiconductivity type semiconductor material are electrically joined together by suitable means whereby at least two PN junctions are joined together to form one convoluted PN junction having a substantial portion of the junction parallel to the two opposed major surfaces. The substantial portion of the convoluted PN junction consists of at least two substantially parallel segments spaced apart from each other. Means are provided to electrically connect all like kind of semiconductivity into an electrical circuit external to the solar cell.

DRAWINGS

In order to better understand the nature and objects of this invention reference should be had to the following detailed drawings in which the thicknesses of the bodies have been greatly enlarged;

DESCRIPTION OF THE INVENTION

Figure 1:
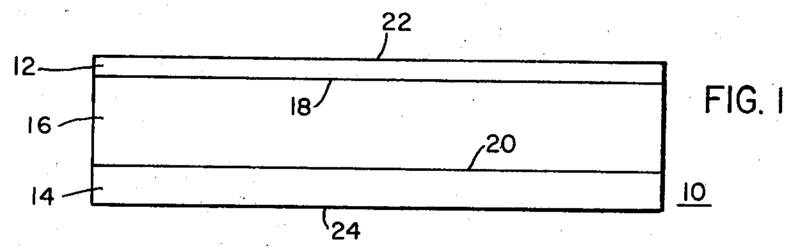
FIGS. 1 through 4 are vertical cross-sectional views of a solar cell being processed in accordance with the teachings of this invention.

Referring to FIG. 1 there is shown a solar cell 10 comprising two regions or layers 12 and 14 of N type semiconductivity and one intermediate layer or region 16 of P type semiconductivity. Three or a higher odd number of N type layers can be employed with a P type layer between each two successive N type layers. Essentially parallel PN junctions 18 and 20 are present between respective adjoining contiguous layers or regions 16 and 12 and 16 and 14. The cell 10 has substantially flat, parallel top and bottom surfaces 22 and 24, respectively. As compared to a conventional photocell with a single N type surface layer and a single P type back layer, a photocell with three N type layers and two interposed P type layers should have roughly a 35% increase in collection efficiency.

The uppermost layer 12, which is exposed to the impinging source of radiation, is very thin, its thickness being preferably from 0.3 micron to 0.5 micron. This thinness minimizes light absorption and carrier generation in the layer 12. Since it is the exposed region, more than one-half of the carriers generated by the light photons in this layer 12 are lost by recombination at the surface 22. The semiconductor material of the layer 12 is heavily doped to reduce the resistivity of the region and therefore lower the cell series resistance.

The layers 14 and 16 each have a preferred thickness of less than the diffusion length of the minority carriers generated within the cell 10 when it is activated by exposure to solar radiation. Should layers 12 and 14 be formed by simultaneous diffusion of an N type doping material into both surfaces of a P type substrate, both layers 12 and 14 preferably will be from 0.3 micron to 0.5 micron in thickness and will be heavily doped. Should the layers 12 and 14 be expitaxially grown, then the thickness and impurity concentration of each of these layers can be independently controlled. The layer 14 need not be of the same level of impurity concentration as the layer 12. Since the layer 14 is not exposed directly to the impinging radiant source of energy, the layer 14 can therefore have a lower level of impurity concentration than the layer 12. The layer 14 may also be greater in thickness than the layer 12 provided it does not exceed the preferred thickness equal to approximately the diffusion length of the minority carriers generated within layer 14 of the cell 10. The layer 14 is preferably thicker than the layer 12, but is thinner than the layer 16. The preferred thickness of the layer 14 is to minimize carrier loss since many of the carriers can be lost at the surface 24 by recombination.

When light impinges on the upper surface 22 and penetrates into and through layer 12, photons are absorbed in the structure of the solar cell 10 whereby hole-electrons pairs result and minority carriers produced anywhere within the body of cell 10 will have only a short distance to diffuse to reach one of the PN junctions 18 and 20 and be collected. Since the layers 12, 14 and 16 each have a thickness of less than the diffusion length of the carrier generated, generated carriers will be much more likely to reach the junctions 18 and 20 than to recombine and thereby the collection efficiency of cell 10 is improved over that of conventional two-region solar cells of the prior art devices.

It is desirable to keep the top surface 22 of the solar cell 10 clear of any ohmic electrical contacts in order that the surface 22 may have as great a photon-penetrable area exposed to the impinging radiant energy source as is possible. Electrical contacts can be affixed to the end surfaces of the layers 12, 14 and 16, however the carriers collected in the areas of the respective layers a considerable distance from the contacts must travel laterally a relatively long distance within the layer before reaching the ohmic contacts of each layer. The electrical resistivity of the layers 12, 14 and 16, particularly of layer 12, is relatively high so that this electrical current flowing laterally to the electrical contacts on the side surface encounters a high cell series resistance. Therefore, the electrical contacts to the layers 12, 14 and 16 are all made from the side of the surface 24 which is the opposed surface to surface 22 which is exposed to the source of radiant energy, in a fashion discussed in the succeeding paragraphs.

Figure 2:
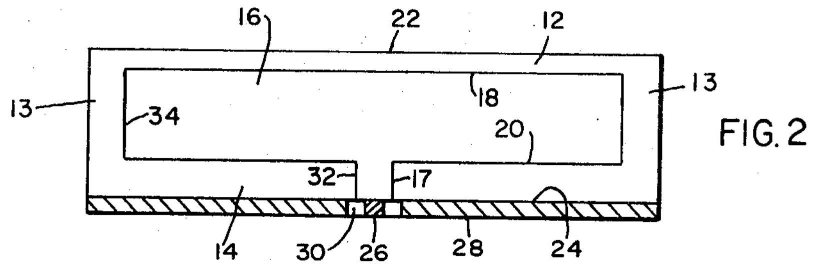

The structure of the solar cell 10 can be made from wafers of suitably doped semiconductor material or from an elongated strip or flat body of P type semiconductor material such, for example, as silicon, in the form of webbed, dendritic material such as disclosed in U.S. Pats. 3,129,061 and 3,162,507. Top and bottom layers 12 and 14 of N type semiconductor material are formed, for example, either by epitaxial deposition of N type silicon on, or by diffusion of N type dopant into the opposed major surfaces of the strip comprising the layer N. Thereafter, as shown in FIG. 2, a sufficient area of the layer 16 is made available such, for example, as by diffusing one or more rod-like regions 17 through 14 from the bottom surface 24 to region 16 to provide for a good ohmic electric contact 26 to be applied to the region 17 and hence to the region 16. An ohmic electrical contact 28 is affixed to the layer 14. The contacts 26 and 28 are separated from each other by an isolation groove 30 which prevents an electrical short circuit from occurring between the contacts 26 and 28 and prevents either of the contacts 26 and 28 from electrically short-circuiting a PN junction 32 formed by the contiguous surfaces of the P type and N type semiconductor materials. The PN junction 32 is exposed in, and extends from, the surface 24 to intersect, and electrically connect with, the PN junction 20.

The layer 12 may be electrically connected to the contact 28 by suitable means such, for example, as by diffusing of an N type dopant into the side surfaces of the material comprising the solar cell 10. The diffusing may be accomplished simultaneously when the layers 12 and 14 are formed by diffusion or if the layers 12 and 14 are formed by epitaxial growth techniques then the sides can be diffused in a subsequent operation or prior to the formation of the layers. In either case the layers 12 and 14 are joined together electrically by a region 13 of like semiconductivity and a PN junction 34 intersecting and electrically connecting together the PN junctions 18 and 20. Being electrically joined together the PN junctions 18, 20, 32 and 34 form one convoluted PN junction with a substantial portion of the convoluted PN junction being essentially parallel to both the top surface 22 and the bottom surface 24. The multilayer solar cell is therefore now, for all intents and purposes a two region solar cell having higher efficiency than prior art two region solar cells.

As shown, the regions 13 and 17 enable one to eliminate the need for any electrical contact being disposed on the top surface 22 therefore making the entire area of the surface 22 an active surface area for the cell 10. The layer 16 of P type semiconductor material is at least thick enough to trap nearly all of the photons impinging on the solar cell 10, and it is approximately two diffusion lengths in thickness. The layer 12 is from 0.3 micron to 0.5 micron in thickness. The layer 14 need not be of the same uniform impurity concentration throughout and need not have the same thickness as the layer 12. The thickness of layer 14, like that of layer 12, is a compromise between requirements of low generated-carrier recombination loss and low cell series resistance; but since the photons are mostly absorbed before reaching layer 14, the generated-carrier density is much less there than in layer 12. Therefore, the thickness of layer 14 is much less critical than that of layer 12, although optimally it should still be considerably less than a diffusion length, probably in the range of 3 to 10 microns.

Figure 3:
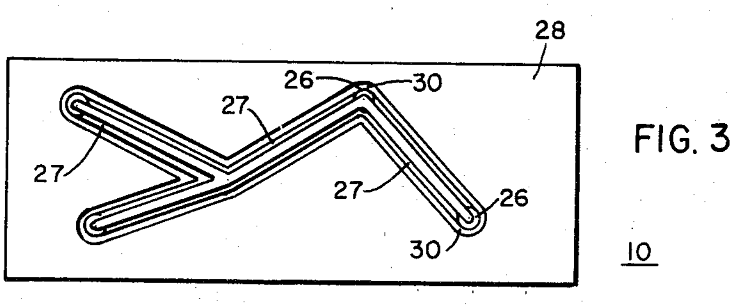

It is to be noted that where long strips of webbed dendritic material are employed, the electrical resistance within the cell 10 may be great enough to require more than a single contact to the layer 16 to secure good efficiency. Therefore enough electrical contacts 26 must be distributed over the back surface to permit the most efficient means of collecting the carriers generated within the solar cell 10. Each contact 26 should be slightly smaller than the surface of each region 17 so as to permit the greatest coverage of its surface, but sufficiently removed from any portion of the PN junction 32 exposed at the rear surface 24, whereby it permits a good ohmic electrical contact to be achieved with the regions 17. All the contacts 26 are then suitably joined together electrically as by a lead from each contact 26 to another contact 26 to provide one electrical connecting means to an external electrical circuit to contact the P type layer 16 of the cell 10. A layer 27 of an electrically insulating material is provided on the surface 24 to prevent accidental electrical short circuiting of region 14 by the contacts 26 from occurring. The physical arrangement of the contacts 26 and 28 may be as shown in FIG. 3.

Figure 4:
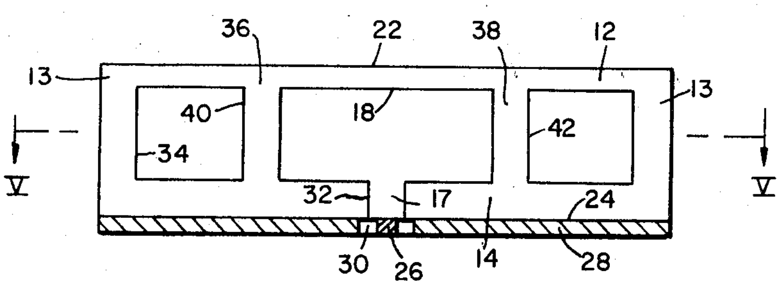
Figure 5:
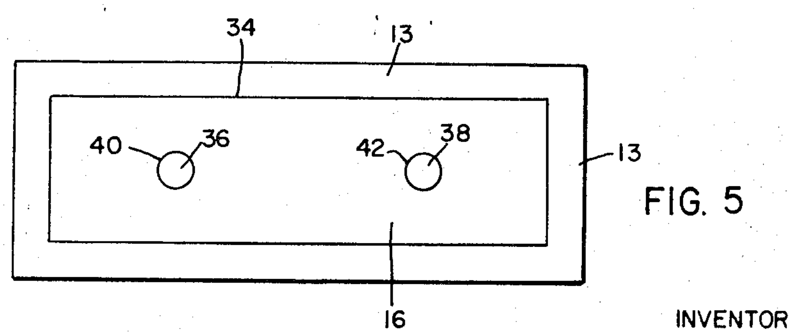
FIG. 5 is a cross-section of the solar cell of FIG. 4 taken along the cutting plane V—V.

Should the edge or side region 13 fail to achieve a sufficient low resistance path between layers 12 and 14, other low resistance paths may be formed between the layers 12 and 14 as shown in FIGS. 4 and 5. With reference to FIGS. 4 and 5 the layers 12 and 14 are connected electrically by centrally disposed low resistance rod-like regions 36 and 38 formed between the aforementioned layers by suitable means such, for example, as by spot diffusion or temperature gradient zone melting. As shown in FIG. 5, during the process which produced region 13 there also were produced several centrally located regions 36 and 38 of N type semiconductivity each of which also forms a low resistance electrical connection between layer 12 and 14. PN junctions 40 and 42 are formed between each of the respective regions 36 and 38, and the layer 16 of P type material, the PN junctions 18, 20, 32, 34, 40 and 42 all being physically and electrically connected together to form one convoluted PN junction within the cell 10, whereby photons of radiated energy impinging on surface 22 will pass through two parallel portions of the convoluted PN junction in reaching the back surface 24.

The number of layers of semiconductor material of opposite type semiconductivity alternately disposed in contact with each other and substantially parallel to the top surface of a solar cell constructed in accordance with the teachings of this invention need not be restricted to only three layers as shown, but may also be made with four or more layers of semiconductor material.

Figures 6, 7:
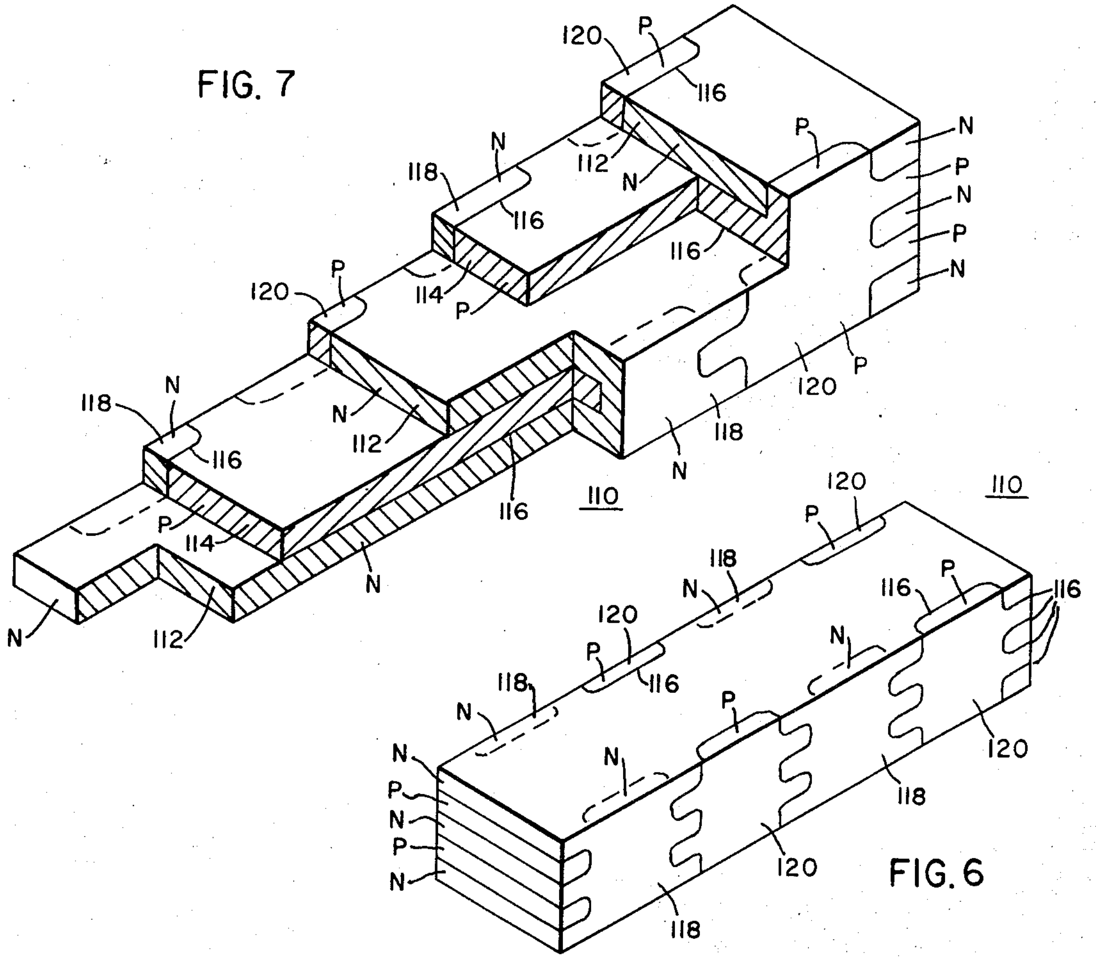
FIG. 6 is an isometric view of a solar cell made in accordance with the teachings of this invention.
FIG. 7 is an isometric view, partly in cross-section, of the solar cell of FIG. 6.
Figure 8:
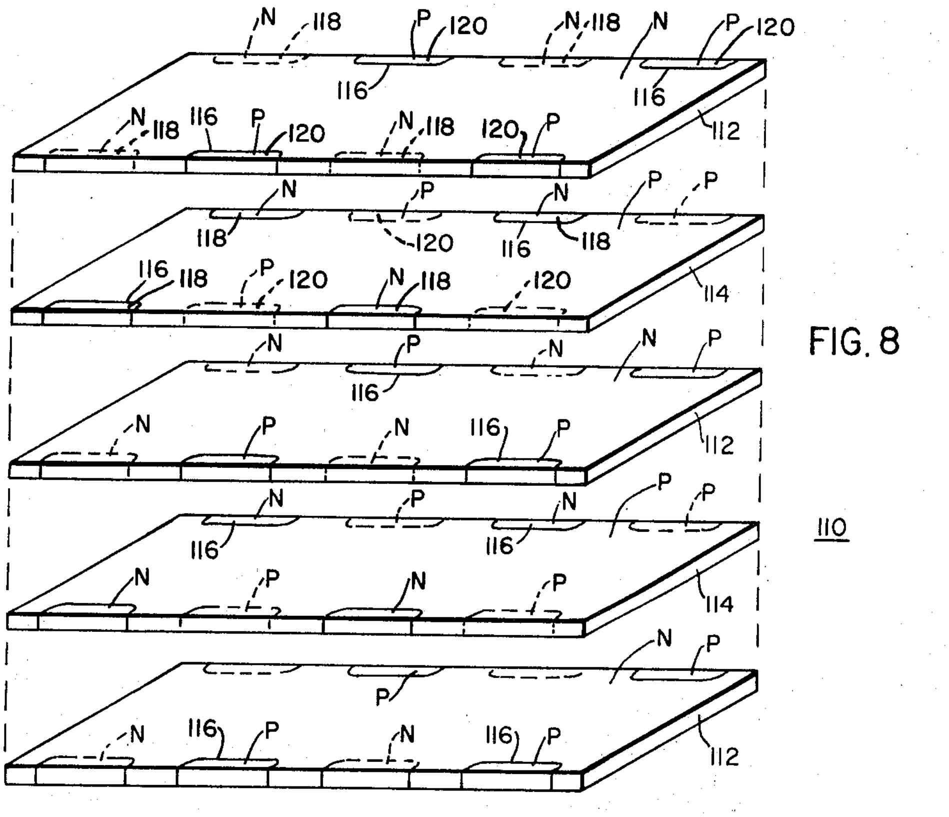
FIG. 8 is an exploded view of the solar cell of FIG. 6.

Employing the teachings of this invention as presented herein, there is shown in FIGS. 6, 7 and 8 a solar cell 110 which is an embodiment having some advantages over the solar cell 10 described heretofore. Generally, this improved solar cell 110 comprises an N region and a P region interconvoluted or interconnected so as to present to a passing photon of light a plurality of substantially parallel alternately and successively disposed N type and P type layers of semiconductor material. Each of the layers has a preferred thickness of less than the diffusion length of the minority carriers generated within the cell when it is activated by exposure to solar radiation. The top layer is very thin, preferably from 0.3 micron to 0.5 micron in thickness, and has a high level of impurity concentration to reduce the electrical resistance within the layer. The bottom layer may be of the same thickness and doping concentration as the top layer, though as heretofore described it may have a thickness greater than that of the top layer but less than that of the intermediate layers. For some purposes the bottom layer may also have a level of doping impurity concentration less than that of the top layer. When initially prepared, a PN junction 116 exists as several separate PN junctions formed by the contiguous surfaces of the adjacent layers 112 and 114 of different type semiconductivity. Employing suitable means, such, for example, as diffusion through masks, N type regions 118 and P type regions 120 may be produced in any suitable arrangement about the sides and ends of the cell 110. The N type regions 118 connect the N type layers 112 together and the P type regions 120 connect the P type layers together whereby only common regions 112 and 114 exist. Each contiguous surface of each region 118 with a layer 114 forms a PN junction which is a segment of the convoluted PN junction 116. In the same manner, each contiguous surface of region 120 and a layer 112 forms a PN junction which is a segment of the convoluted PN junction 116. The exploded view in FIG. 8 illustrates how the cell 110 comprises basically five parallel flat integral layers or plates. Each layer or plate has at its sides or edges diffused regions 118 and 120. The contiguous surfaces of the opposite type semiconductor material form PN junctions which are small segments of the complete convoluted PN junction 116, whereas the contigous surfaces of the flat contacting surfaces of layers 112 and 114 are the major PN junction segments of the convoluted junction 116. When all the plates or layers 112 and 114 of FIG. 8 are stacked together all the segments of the convoluted PN junctions 116 are physically connected together to form one continuous common PN junction. FIG. 7 illustrates in perspective and section both the horizontal and the vertical physical connecting of all the segments of the junction 116. Appropriate ohmic electrical connections can be made to the regions of opposite type semiconductivity to make the cell 110 operative as a source of electrical energy when irradiated.

As previously described heretofore, the external top layer 112 is preferably from 0.3 micron to 0.5 micron in thickness. All the other layers, 112 and 114 are preferably less than one diffusion length in thickness of the minority carriers generated in the cell. However as discussed previously, the bottom layer 112 may be thicker than the front layer and have a lesser impurity concentration than the top external layer.

Ohmic electrical contacts may be affixed to the bottom of the solar cell 110 following the technique employed in applying contacts 26 and 28 in fabricating the solar cell 10.

Figure 9:
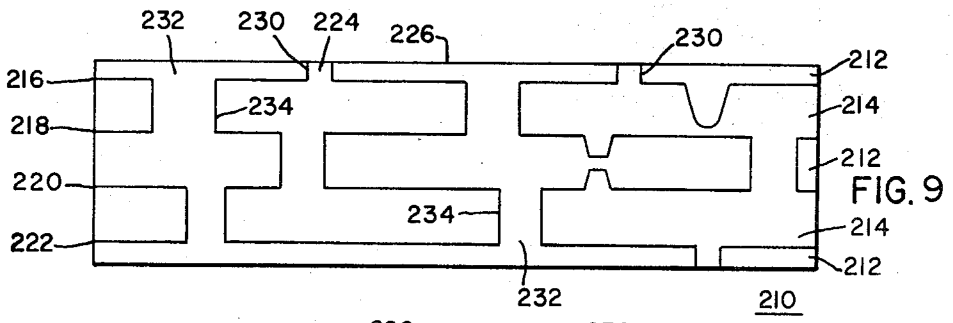
FIG. 9 is a vertical cross-sectional view of another modification of a partially completed solar cell, in accordance with the teachings of this invention.
Figure 11:
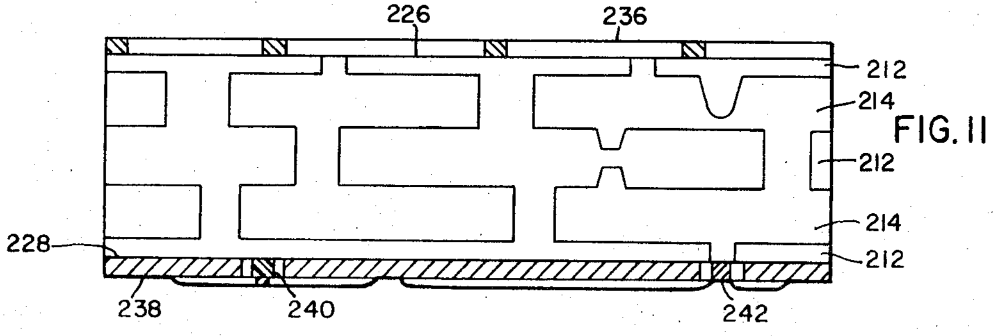
FIG. 11 is a vertical cross-sectional view of the completed solar cell of FIG. 9 illustrating the ohmic contacts affixed thereto.
Figure 10:
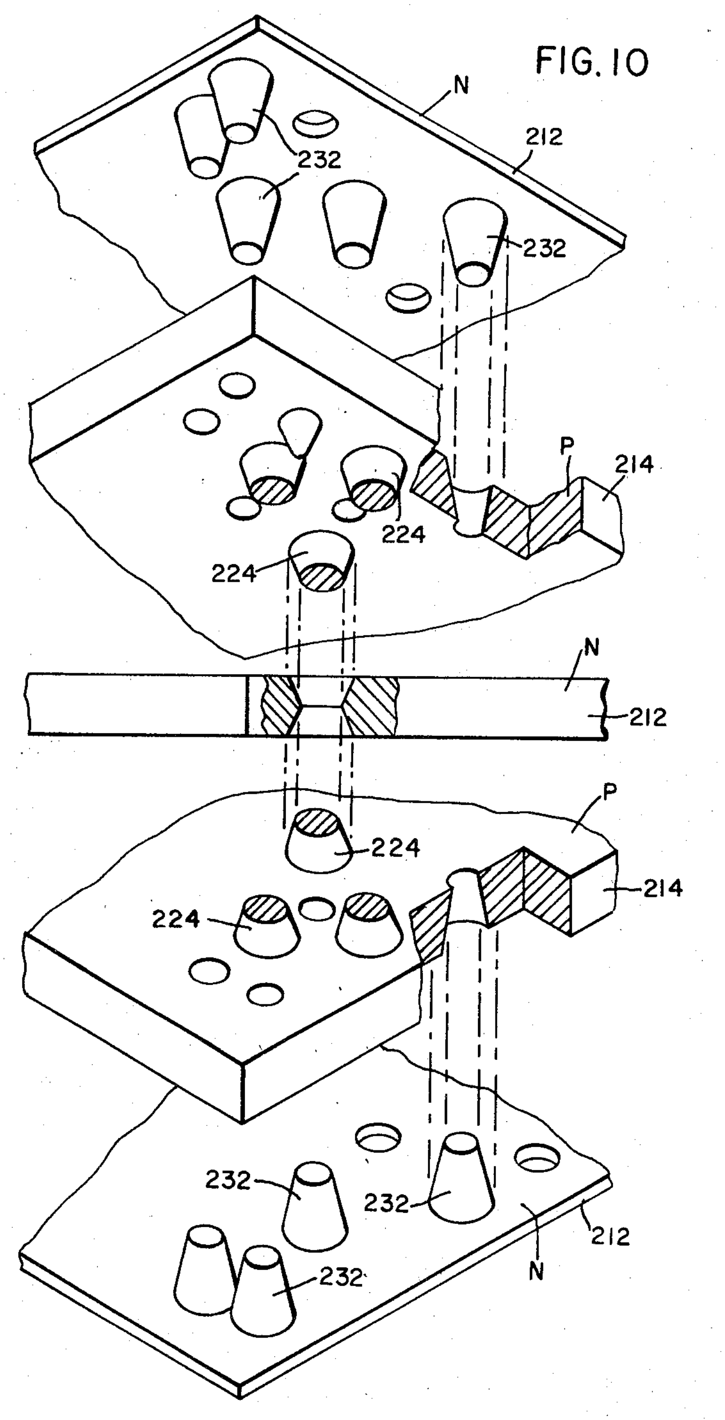
FIG. 10 is a fragmentary exploded view of the solar cell of FIG. 9 showing the interconnecting regions which produce a convoluted PN junction made in accordance with the teachings of this invention.

Referring to FIGS. 9, 10 and 11, there is shown another form of solar cell 210 in accordance with the invention, comprising a plurality of substantially parallel layers 212 of N type semiconductivity material and a plurality of substantially parallel layers 214 of P type semiconductor material. The contiguous surfaces of opposite type semiconductivity form PN junctions 216, 218, 220 and 222. The alternately disposed layers 212 and 214 form a solar cell 210 of NPNPN configuration. The front layer 212 is of approximately the same thickness as the top layer previously described, from 0.3 micron to 0.5 micron. The thinness of this surface layer 212 minimizes light absorption and carrier generation in this surface layer 212 since many of these carriers can be readily lost by surface or bulk recombination.

A plurality of rod-like P type semiconductivity regions 224 are formed in the structure of the solar cell 210 from either one, or both, of the opposite surfaces 226 and 228, from the sides, or the ends of the structure thereby forming PN junctions 230 where the surface is contiguous with an N type region 212. Similarly a plurality of pipe-like N type semiconductivity regions 232 are formed in the P type regions 214 of the cell 210 for interconnecting the top, bottom and middle layers of the N type layers 212 and forming PN junctions 234 when a surface of any of the regions 212 is contiguous with a P type region 214. These pipe-like regions 224 and 232 provides a ready means whereby the PN junctions formed by the contiguous surfaces of regions of opposite type semiconductivity are connected together both physically and electrically to form one contiguous PN junction having a convoluted shape. Thus a photon of light can penetrate through a series of parallel PN junctions and when it finally generates a minority carrier anywhere in the cell 210, such carrier is so near a PN junction that it is highly likely to reach such junction, and very few carriers are lost through recombination.

The solar cell 210 may be made in several ways. One may make the cell 210 from a combination of diffused and epitaxially grown layers of semiconductor material or by depositing a P type epitaxially grown layer of semiconductor material on each face of a flat N type substrate and then two thin N type epitaxial layers. The interconnecting regions of semiconductivity may be all diffused regions or some may be formed by diffusion and the remainder formed by an epitaxial growth process involving one of the layers of P or N type semiconductor material, as disclosed previously.

The ohmic electrical connections to the solar cell 210 may be made by any of the methods described heretofore for the solar cell 210. Referring to FIG. 11 there is shown a method of affixing electrical connections to the cell 210 whereby a grid electrical contact 236 on the surface 226 and a large area electrical contact 238, and a layer 243 of electrically insulating material as required, affixed to the surface 228 is employed to provide an external electrical contact to the cell 210. Electrical contacts insulated from the contact layer 238 are affixed to the P type regions of the cell 210 in the same manner as the electrical contacts 26 and 28 of the solar cell 10 as shown in FIGS. 3 and 4.

Figure 12:
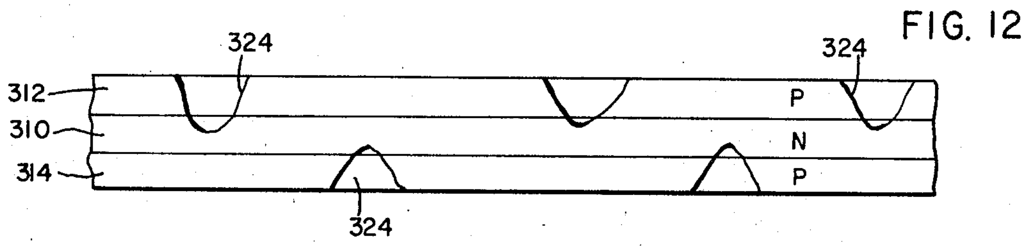
FIGS. 12 and 13 are vertical views, partly in cross-section, of a body of semiconductor material being processed in accordance with the teachings of this invention.

A single convoluted PN junction with a plurality of parallel portions may also be formed in still another manner. Referring to FIG. 12, a body 310 of semiconductor material preferably of a thickness of less than one diffusion length of a minority carrier to be generated therein, and having, for example, N type semiconductivity has two layers 312 and 314 of P type semiconductor material grown on its opposed major surfaces 316 and 318 whereby PN junctions 320 and 322 are formed therebetween. Each of the layers 312 and 314 is preferably less than one diffusion length in thickness of the minority carrier generated therein. A plurality of depressed regions, or pits 324 are formed which extend through at least one of the layers 312 and 314 and partly into the body 310. The pits may be formed by such suitable means as chemical etching.

Figure 13:
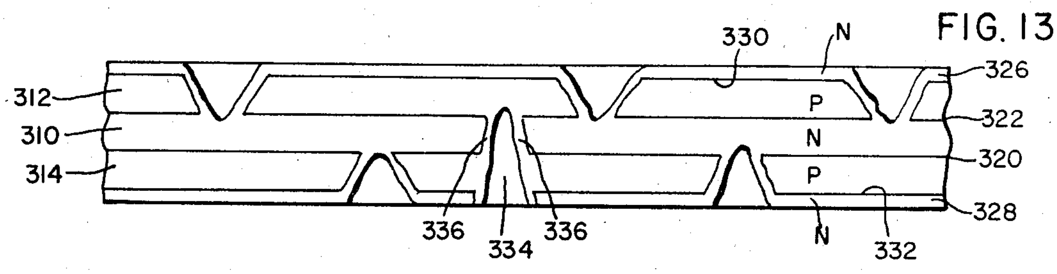

Referring now to FIG. 13, N type semiconductor material is grown in layers 326 and 328 approximately 0.3 micron to 0.5 micron in thickness on the respective layers 312 and 314, traversing the PN junctions 320 and 322 where applicable and on the exposed portions of the body 310 in the bottom of the pits 324. PN junctions 330 and 332 are formed by contiguous surfaces of the respective layers 326 and 312, and 328 and 314. All of the N type semiconductor material is now physically, as well as electrically joined together. A second set of depressed regions, or pits, 334 are formed in the processed body 310. The pits 334, as well as the pits 324, may be aligned to permit a hole to be made through the processed body 310, although this is not essential. A P type dopant material is diffused into the processed body 310 through the inner surfaces of the pits 324, forming regions 336 of P type semiconductivity in the immediate area of the pits, or apertures, 334 Those pits 324, which do not penetrate completely through the substrate, should at least penetrate into the first P-layer on the opposite side of the mid-region of N type conductivity from the major surface where the pits 324 originate. After being doped, the walls of the pits join the junctions 320 and 322 together into a single convoluted PN junction having major parallel portions.

Alternately the N type and P type regions may each be suitably connected by corresponding semiconductivity type material to form the convoluted PN junction by employing the temperature gradient zone melting process. All N type layers 310, 326 and 328 may be joined together into one N type region by employing this process applied to antimony doped germanium material being zone-melted into the processed body 310. In a similar manner molten aluminum or molten gallium may be employed in the process to join all the P-layers 312 and 314 into one P type region.

Figure 14:
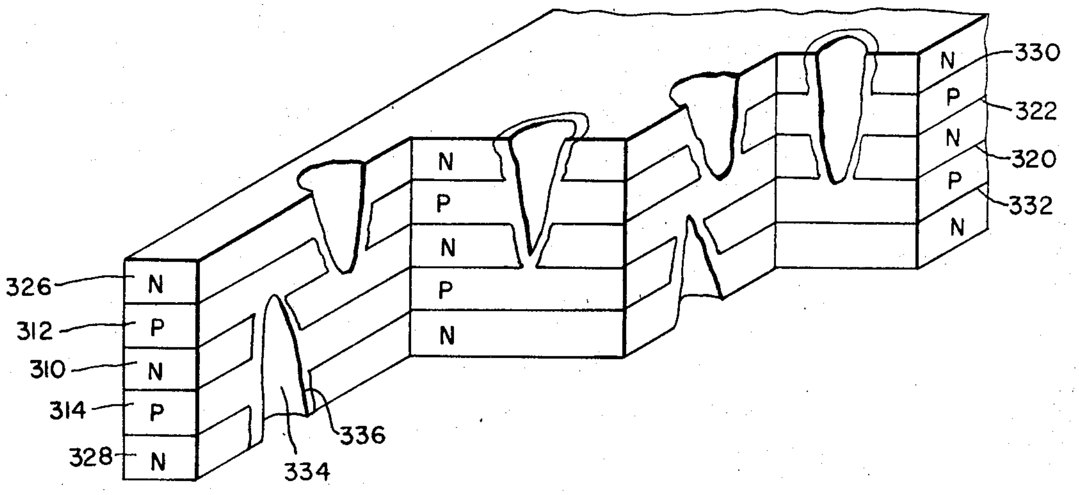
FIG. 14 is an isometric view, partly in cross-section, of the processed body of FIG. 13.

With reference to FIG. 14 there is shown the processed body 310 where both the pits 324 and 334 are formed through opposed major surfaces after all layers of semiconductor material have been grown on the body 310. All regions of like conductivity are joined together by regions of like conductivity formed by a separate diffusion process in each instance of different type semiconductivity material. The PN junctions 320, 322, 330 and 332 are one convoluted PN junction. Electrical connections can be made in the manner disclosed heretofore to the appropriate regions of opposite semiconductivity type to form a circuit for flow of electrical energy.

Although all solar cell examples described herein have been described as having three or five contiguous layers, or regions, of opposite type semiconductor material, any number either even or odd of layers or regions, may be employed so long as one can efficiently collect the majority of carriers generated by the radiation source impinging on the active surface area of the cells.

Preferably the surface layer, or region, of each solar cell, made in accordance with the teachings of this invention, is composed entirely of one type of semiconductivity. When electrical contact grids are employed on the surface of the cell exposed to the radiant source of energy, the total area of the surface covered by the grid should be no greater than 10 percent, and preferably greater than 5 precent. The overall size of depressions, or apertures, or interconnecting regions, exposed in the top surface of a solar cell should be as small as practical since they contribute less carrier generation potential than the balance of the regions comprising the solar cell. The greatest portion of the convoluted PN junction is preferably substantially parallel to the surface exposed to the source of radiation. Both regions of opposite type semiconductivity comprising the rear side of the solar cell must have sufficient area in order to make a good electrical contact thereto.

Figure 15:
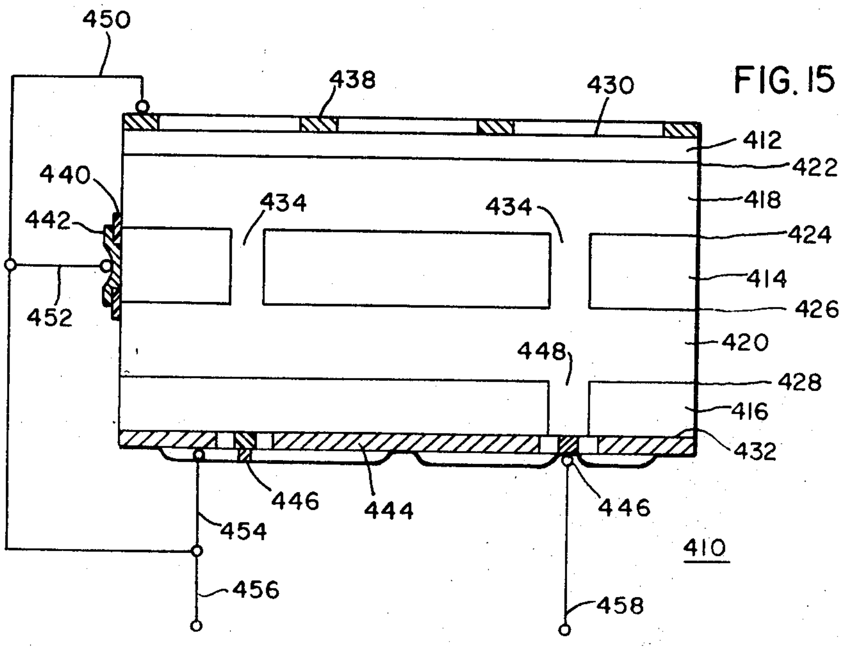
FIG. 15 is a vertical cross-sectional view of a solar cell made in accordance with the teachings of this invention.

Referring now to FIG. 15 there is shown a solar cell 410 having three layers 412, 414 and 416 of N type semiconductivity. PN junctions 422, 424, 426 and 428 are between respective contacting regions 412 and 418, 418 and 414, 414 and 420 and 420 and 416. Opposed major surfaces 430 and 432 are respectively, top and bottom surfaces of the cell 410.

The thickness of the layers, the material of each of the layers, and the electrical characteristics of each of the layers of the cell 410 are the same as described heretofore for the solar cells of this invention.

Rod-like regions 434 of P type semiconductivity extend through the layer 414 to connect the layers 418 and 420 and P type semiconductivity. The distribution of the region 434 is the same as described heretofore. As a result of the interconnection of the layers 418 and 420 into essentially one region of P type semiconductivity, the PN junctions 424 and 426 are joined together by PN junctions 436 formed between the regions 434 and the layer 414 into one convoluted PN junction.

An electrical contact grid 438 is affixed to the top surface 430 thereby forming an electrical connection to the layer 412. A layer 440 of electrically insulating material such, for example, as silicon oxide, silicon nitride, aluminum nitride and the like is disposed on an exposed end portion of each of the PN junctions 424 and 426 and the adjacent surface area of the layers 418, 414 and 420. Electrically conductive metal is deposited as a layer 442 on the layer 440 and the exposed surface of the layer 414 therebetween to form an electrical connection to the layer 414.

Electrical contacts 444 and 446 are affixed to the respective layers 416 and 420 in the same maner as described heretofore in describing the solar cell 410 and its electrical contacts 26 and 28 to the respective layers 14 and 16. Rod-like P type regions 448 provide electrically conductive means from the contact 446 in the surface 432 to the layer 420. Electrical leads 450, 452 and 454 electrically connect all of the layers of N type semiconductivity together. Electrical lead 456 electrically connects all the N type layers into an electrical circuit external to the cell 410. An electrical lead 458 electrically connects all the P type layers into an electrical circuit external to the cell 410.

By means of the electrical connections shown in FIG. 15, all N type layers are joined together and all P type layers are joined together. PN junctions 422 and 428 are connected in a parallel circuit relationship with each other. PN junctions 424 and 426 are joined together as one convoluted PN junction geometrically independent of the two PN junctions but electrically connected in parallel with them by means of the leads.

I claim as my invention:

1. A solar cell comprising:

a body of semiconductor material having two substantially parallel opposed major surfaces, one of the major surfaces being exposed to radiation, and at least two PN junctions through which photons of radiation can pass in going from the front surface to the back surface, each PN junction being substantially parallel to the two opposed major surfaces, the junctions being formed by a plurality of substantially parallel alternate layers of first type and second type semiconductivity semiconductor material;

means for electrically connecting all layers of like semiconductivity type semiconductor material together into an electrical circuit arrangement; and means for electrically connecting layers of like kind of semiconductivity into an electrical circuit external to the solar cell.

2. The solar cell of claim 1 in which:

the distance between adjacent PN junctions is approximately one diffusion length of a minority carrier generated within the solar cell.

3. The solar cell of claim 2 in which:

the body of semiconductor material has two PN junctions and three layers of semiconductor material, the first and the third layers being of first type semiconductivity and the second layer being of second type semiconductivity, a surface of each of the first and third layers comprising the two opposed major surfaces of said body.

4. The solar cell of claim 1 in which:

the body has at least two exposed lateral surfaces, means for electrically connecting all layers of first type semiconductivity comprises a first layer of an electrically insulating material disposed on the exposed portions of the PN junctions at one portion of the lateral surfaces and all of the exposed layers of second type semiconductivity and a first layer of an electrically conductive material disposed over the layer of electrically insulating material and all adjacent exposed surfaces of the layers of the first type of semiconductivity whereby to electrically connect the layers of first type semiconductivity, and a second layer of electrically insulating material and all ad- the exposed portion of the PN junctions at another portion of the lateral surfaces and exposed layers of the first type semiconductivity adjacent thereto, and a second layer of electrically conductive material disposed over said second layer of electrically insulating material and any adjacent surface area of the last mentioned exposed layers of said body.

5. The solar cell of claim 3 in which:

the means for connecting the first and third layers together electrically comprises a first electrical contact electrically connected to one of the two major opposed surfaces and a second electrical contact electrically connected to the other of the two major opposed surfaces, the two electrical contacts being electrically connectable into an external electrical circuit.

6. The solar cell of claim 5 in which:

a selective portion of the third layer of the body of semiconductor material is removed to expose a predetermined surface area of the second layer substantially parallel to the two major opposed surfaces; and the means for electrically connecting said second layer into an electrical circuit external to the solar cell comprises an electrical contact disposed on said predetermined surface area of said second layer and electrically connected to said second layer.

7. The solar cell of claim 5 including:

at least one region of semiconductor material having the same type semiconductivity as said second layer disposed within and extending entirely through the third layer from said second layer, said at least one region having a surface area exposed in, and comprising in part, the other of the two major opposed surfaces; and the means for electrically connecting said second layer into an electrical circuit external to the solar cell comprises an electrical contact disposed on at least the exposed surface area of the at least one region of semiconductor material disposed within and extending entirely through said third layer.

8. The solar cell of claim 3 in which:

said means for electrically connecting the first and the third layers of first type semiconductivity together consists of a region of second type semiconductivity formed in the entire outer peripheral portion of, and extending entirely through, said second layer to join together both physically and electrically the first and third layers and enclosing said second layer therein;

the means for electrically connecting said second layer of second type semiconductivity into an electrical circuit external to the solar cell comprises at least one region of first type semiconductivity formed within, and extending entirely through, one of the first and third layers from one of the two opposed major surfaces to the second layer and an electrical contact electrically connected to at least one of said at least one region of second type semiconductivity; and the means for electrically connecting the first and the third layers of first type semiconductivity into an electrical circuit external to the solar cell comprises an electrical contact electrically connected to the opposed major surface to which said at least one region of second semiconductivity extends.

9. The solar cell of claim 8 in which:

the means for electrically connecting the first and the third layers of first type semiconductivity includes at least one region of first type semiconductivity disposed within, and extending entirely through, said second layer thereby electrically joining together the first and third layers.

10. The solar cell of claim 2 in which:

the means for electrically connecting together all layers of like semiconductivity type comprises at least one region of the same type semiconductivity as the layers being electrically joined together formed in an exposed peripheral surface of said body and extending the entire distance between the two opposed major surfaces of the body.

11. The solar cell of claim 2 in which:
the means for electrically connecting together all layers of like semiconductivity type comprises a plurality of regions of the same type semiconductivity as the layers being electrically joined together, each of said plurality of regions extending entirely through at least one layer of opposite type semiconductivity semiconductor material to electrically connect at least two layers of like semiconductivity together.

12. The solar cell of claim 11 in which:
each layer of semiconductor material having a major surface comprising substantially all of one of the two opposed major surfaces of the body has a first type semiconductivity;
the means for electrically connecting all layers of second type semiconductivity into an electrical circuit external to the solar cell comprises at least one region of second type semiconductivity formed within one of the two layers of first type semiconductivity having a surface comprising one of the two major opposed surfaces and extending through said at least one of the layers from one of the layers of second type semiconductivity to the one of the two major opposed surfaces where said at least one region has a surface exposed thereat thereby comprising in part a portion of the one of the two opposed major surfaces of the body and an electrical contact electrically connected to the exposed surface of the said at least one region of second type semiconductivity.

13. The solar cell of claim 12 in which:
the means for electrically connecting the layers of first type semiconductivity into an electrical circuit external to the solar cell comprises an electrical contact affixed to, and electrically connected to, the one of the two opposed major surfaces in which said at least one region of second type semiconductivity has a surface exposed thereat.

14. The solar cell of claim 13 in which:
an electrical contact is affixed to, and electrically connected to, the other of the two opposed major surfaces, said electrical contacts affixed to the two opposed major surfaces being electrically connected together.

15. The solar cell of claim 11 including:
a selective portion of a first layer of semiconductor material having first type semiconductivity comprising one of the two opposed major surfaces being removed to expose a predetermined surface area of the next adjacent layer of semiconductor material having second type semiconductivity;
the means for electrically connecting all the layers of first type semiconductivity into an electrical circuit external to the solar cell comprises a first electrical contact affixed to the surface of said layer having a selected portion removed therefrom; and
the means for electrically connecting all the layers of second type semiconductivity into an electrical circuit external to the solar cell comprises second electrical contact affixed to the exposed predetermined surface area of the layer of semiconductor material having second type semiconductivity.

16. The solar cell of claim 15 including:
a second layer of semiconductor material having first type semiconductivity having a major surface comprising the other of the two opposed major surfaces of the body;
a third electrical contact affixed to, and electrically connected to, the major surface of the second layer of first type semiconductivity; and
said first and said second electrical contacts being electrically connected together.

17. The solar cell of claim 2 including:
a plurality of depressed regions formed in each of the two opposed major surfaces of said body, each of the depressed regions having a surface defining walls of a cavity formed by the depressed region;
a second plurality of layers of first type semiconductivity, each of said second plurality of layers of first type semiconductivity having a surface comprising the surface of one of the plurality of depressed regions, said each of second plurality of layers extending into said body a sufficient distance to transverse at least two PN junctions;
a PN junction between each of the second plurality of layers and each layer of second type semiconductivity it traverses, each of said PN junctions being integral with at least one of said at least two PN junctions being substantially parallel to the two major opposed surfaces of the body;
a third plurality of layers of second type semiconductivity, each of said third plurality of layers of second type semiconductivity having a surface comprising the surface of one of the plurality of depressed regions, said each of third plurality of layers extending into said body a sufficient distance to transverse at least two PN junctions; and
a PN junction between each of the third plurality of layers and each layer of first type semiconductivity it traverses, each of said PN junctions being integral with at least one of said at least two PN junctions being substantially parallel to the two major opposed surfaces of the body.

18. The solar cell of claim 2 in which:
a first layer of semiconductor material having a major surface comprising one of the two opposed major surfaces has a thickness of from 0.3 micron to 0.5 micron; and
a second layer of semiconductor material having a major surface comprising the other of the two opposed major surfaces has a thickness greater than the first layer of semiconductor material and less than each of the remaining layers of semiconductor material of said body.

19. The solar cell of claim 18 in which:
said body has four PN junctions, each of which is substantially parallel to the two opposed major surfaces thereby dividing said body into five alternate layers of first type and second type semiconductivity semiconductor material, said first and said second layers each having first type semiconductivity, a third layer of first type semiconductivity disposed between and in contact with the fourth layer of second conductivity and the fifth layer of second conductivity, said third layer having an exposed side surface; said fourth layer physically contacting said first layer and said fifth layer physically contacting said second layer; and including:
a first electrical contact disposed on the major surface of, and electrically connected to, the first layer;
a second electrical contact disposed on the major surface of, and electrically connected to, the second layer;
a third electrical contact disposed on the exposed surface of, and electrically connected to, the third layer;
at least one region of second type semiconductivity disposed within and extending entirely through said third layer to electrically interconnect said fourth and fifth layers, thereby forming a convoluted PN junction of two of the four PN junctions;
at least one region of second type semiconductivity disposed within and extending entirely through said second layer from said fifth layer to said other of the opposed major surface, each of said at least one region having a surface exposed therein;
a fourth electrical contact disposed on, and electrically connected to, each of the at least one region of second type semiconductivity, said fourth electrical contact being electrically insulated from said second layer and said second electrical contact; and
said first, said second, and said third electrical contacts are connected together electrically whereby said convoluted PN junction and each of the remaining PN junctions are connected into a parallel electrical circuit relationship.

References Cited

UNITED STATES PATENTS

| | | | |
|---|---|---|---|
| 3,103,455 | 9/1963 | John et al. | 148—33.5 |
| 3,183,128 | 5/1965 | Leistiko et al. | 148—33.5 X |
| 3,316,131 | 4/1967 | Wisman | 148—33.5 X |
| 3,434,893 | 3/1969 | Josephs et al. | 136—89 X |

ALLEN B. CURTIS, Primary Examiner

U.S. Cl. X.R.

148—33.5